US012658937B2

(12) United States Patent　　(10) Patent No.:　US 12,658,937 B2

Jadus et al.　　(45) Date of Patent:　Jun. 16, 2026

---

(54) OVERCURRENT DETECTION WITH MULTI-BIT ANALOG-TO-DIGITAL CONVERTERS

(71) Applicant: Analog Devices International Unlimited Company, Limerick (IE)

(72) Inventors: Brian Jadus, Williston, VT (US); Maitrey Shridhar Kamble, Mumbai (IN); Jason J. Ziomek, South Burlington, VT (US)

(73) Assignee: Analog Devices International Unlimited Company, Limerick (IE)

( * ) Notice: Subject to any disclaimer, the term of this patent is extended or adjusted under 35 U.S.C. 154(b) by 236 days.

(21) Appl. No.: 18/659,548

(22) Filed: May 9, 2024

(65) Prior Publication Data

US 2025/0350296 A1　　Nov. 13, 2025

(51) Int. Cl.
　　*H03M 3/00*　　(2006.01)
　　*H02H 3/08*　　(2006.01)

(52) U.S. Cl.
　　CPC .............. *H03M 3/466* (2013.01); *H02H 3/08* (2013.01); *H03M 3/478* (2013.01)

(58) Field of Classification Search
　　CPC ...... H03M 7/702; H03M 7/30; H03M 7/6094; H03M 7/6064; G06N 3/0495; G06N 3/063
　　USPC ................................. 341/143, 155
　　See application file for complete search history.

(56) References Cited

U.S. PATENT DOCUMENTS

| | | | | |
|---|---|---|---|---|
| 4,363,064 | A | * | 12/1982 | Billings ................... H02H 1/06 361/57 |
| 8,754,599 | B2 | | 6/2014 | Sasaki et al. |
| 8,908,390 | B2 | | 12/2014 | Strzalkowski |
| 9,411,003 | B2 | | 8/2016 | Danesh et al. |
| 9,478,977 | B2 | * | 10/2016 | Li .......................... H02J 7/0016 |
| 9,680,493 | B1 | * | 6/2017 | Pritsker ............... H03M 1/0629 |
| 9,813,073 | B1 | * | 11/2017 | Trivedi ............... H03M 1/1071 |
| 9,859,803 | B2 | | 1/2018 | Strzalkowski |
| 10,608,654 | B2 | | 3/2020 | Ali |
| 10,914,789 | B2 | | 2/2021 | Lemkin et al. |
| 2005/0078024 | A1 | | 4/2005 | Harrington |
| 2012/0063045 | A1 | * | 3/2012 | Shearon ................... H02H 1/04 361/65 |
| 2013/0089223 | A1 | * | 4/2013 | Heineman ............... H03F 3/185 381/120 |
| 2015/0180355 | A1 | | 6/2015 | Freeman et al. |
| 2017/0353192 | A1 | * | 12/2017 | Tsai ....................... H03M 3/412 |
| 2022/0252664 | A1 | | 8/2022 | Coyne et al. |
| 2022/0368341 | A1 | * | 11/2022 | Fujimoto .............. H03M 1/164 |

OTHER PUBLICATIONS

"European Application Serial No. 25172053.8, Extended European Search Report mailed Oct. 10, 2025", 14 pgs.

* cited by examiner

*Primary Examiner* — Jean B Jeanglaude

(74) *Attorney, Agent, or Firm* — Schwegman Lundberg & Woessner, P.A.

(57) ABSTRACT

The techniques described herein relate to overcurrent detection with multi-bit analog-to-digital converters (ADCs). An example apparatus includes a multi-bit analog-to-digital converter (ADC) configured to convert an analog signal into a multi-bit digital signal. The example apparatus further includes a threshold detector configured to generate an output signal indicative of an overcurrent condition after a detection of at least a first number of bits of the multi-bit digital signal satisfying a threshold.

20 Claims, 5 Drawing Sheets

OVERCURRENT DETECTION WITH MULTI-BIT ANALOG-TO-DIGITAL CONVERTERS

FIELD

The techniques described herein relate generally to circuits and, more particularly, to overcurrent detection with multi-bit analog-to-digital converters.

BACKGROUND

An analog-to-digital converter (also known as an ADC or an A/D converter) is an electronic circuit that measures a real-world signal (such as acceleration, pressure, speed, and temperature) and converts the measured signal to a digital representation of a signal. An ADC compares samples of an analog signal, such as an analog input voltage, to a known reference voltage and then produces a digital representation of this analog signal. The output of an ADC is a digital binary code.

SUMMARY OF THE DISCLOSURE

In accordance with the disclosed subject matter, systems, apparatus, articles of manufacture, and methods for overcurrent detection with multi-bit analog-to-digital converters are provided.

Some embodiments relate to an apparatus for overcurrent detection. The apparatus comprising a multi-bit analog-to-digital converter (ADC) configured to convert an analog signal into a multi-bit digital signal, and a threshold detector configured to generate an output signal indicative of an overcurrent condition in response to a detection of at least a first number of bits of the multi-bit digital signal satisfying a threshold.

Some embodiments relate to a system for overcurrent detection. The system comprising a first die comprising a multi-bit analog-to-digital converter (ADC) configured to convert an analog signal into a multi-bit digital signal, a threshold detector configured to generate an output signal in response to a detection of at least a first number of bits of the multi-bit digital signal satisfying a threshold; and a primary side of an isolator, the isolator having the primary side, a secondary side, and an isolation barrier formed between the primary side and the secondary side. The system further comprising a second die comprising a rolling average counter configured to generate a signal indicative of an overcurrent condition after the output signal is generated, and the secondary side of the isolator. The system further comprising an electrical connection coupling the primary side of the isolator of the first die to the secondary side of the isolator of the second die.

Some embodiments relate to a method for overcurrent detection. The method comprising converting a sensed current into a voltage, converting, using a multi-bit analog-to-digital converter, an amplification of the voltage into a multi-bit digital signal, and detecting an overcurrent condition in response to at least a first number of bits of the multi-bit digital signal satisfying a threshold.

The foregoing summary is not intended to be limiting. Moreover, various aspects of the present disclosure may be implemented alone or in combination with other aspects.

BRIEF DESCRIPTION OF FIGURES

Various aspects and embodiments will be described with reference to the following figures. It should be appreciated that the figures are not necessarily drawn to scale. Items appearing in multiple figures are indicated by the same or a similar reference number in all the figures in which they appear.

DETAILED DESCRIPTION

Figure 1:
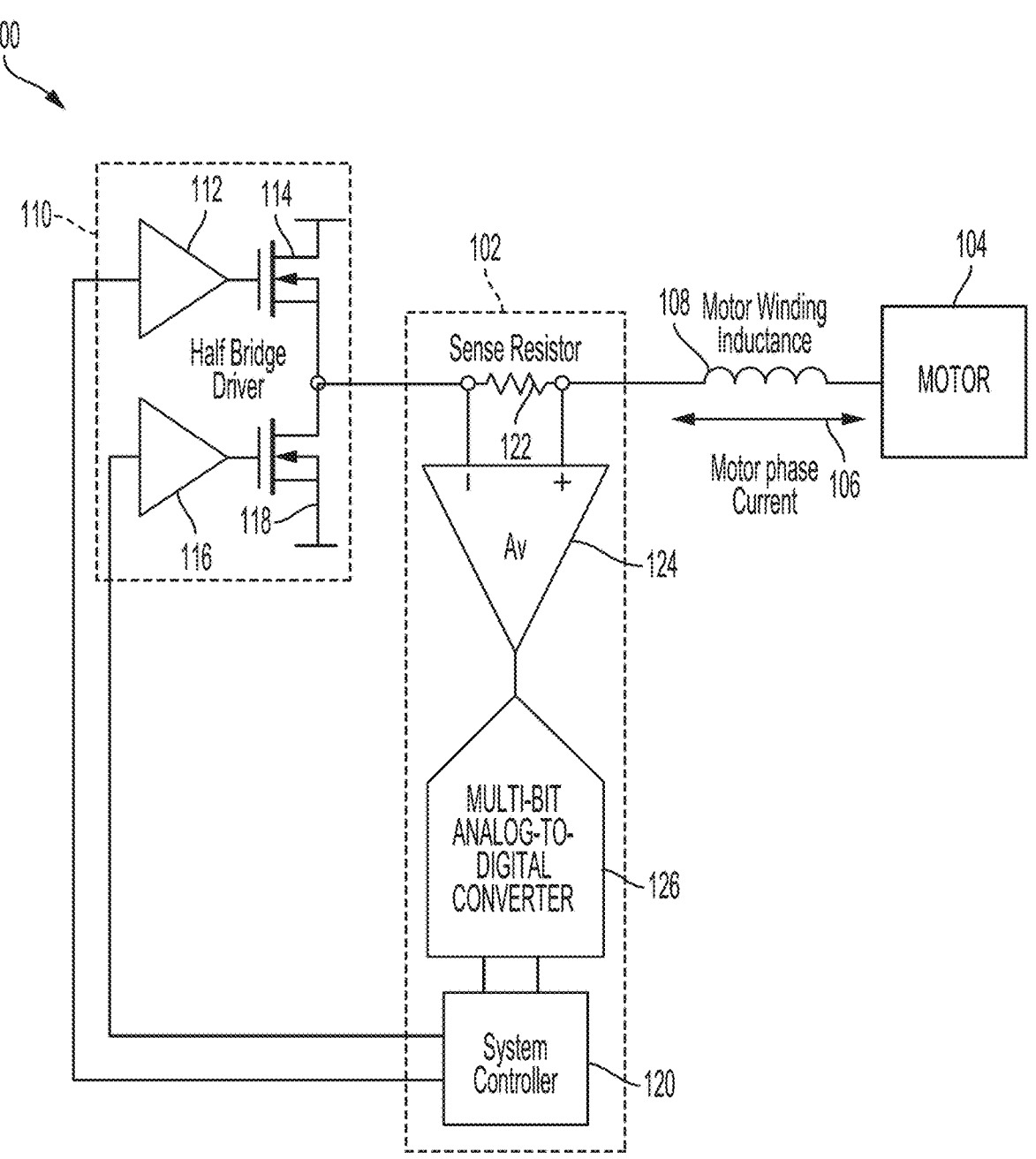
FIG. 1 is a circuit diagram of an example control system including an overcurrent detection system, in accordance with some embodiments.

Described herein are approaches to overcurrent detection using multi-bit analog-to-digital converters (ADCs). A multi-bit ADC compares samples of an analog signal, such as an analog input voltage, to a known reference voltage and then produces a digital representation of this analog signal. The output of the multi-bit ADC is a multi-bit digital signal representing multiple bits of binary data. For example, the multi-bit digital signal may be representative of a digital binary code representing multiple bits of digital data.

Overcurrent detection systems may be used to detect when equipment (e.g., an electric motor) is operating in an unsuitable manner that may compromise user safety and/or cause damage to the equipment. Overcurrent detection systems may be used to change equipment operation to improve user safety and prevent equipment damage when an overcurrent condition of the equipment is detected.

An "overcurrent condition" may refer to operation of a device or equipment that exceeds specified operating conditions, which may be represented by thresholds. Example operating conditions include an operating electrical current and an operating electrical voltage. For example, an overcurrent condition may be identified (e.g., detected) when a measurement associated with device/equipment operation exceeds a threshold. Examples of the measurement include a current measurement and a voltage measurement. Examples of the threshold include a current threshold and a voltage threshold. For example, an overcurrent condition may be identified (e.g., detected) when a current measurement exceeds a current measurement threshold.

Conventional overcurrent detection systems may use a 1-bit sigma delta modulator (SDM) ADC to convert a voltage measurement representative of a sensed current into a useful conversion result. The conversion result may be indicative of whether an overcurrent condition is detected. 1-bit SDM ADCs (or single bit SDM ADCs) operate with a high frequency clock in a summing and differencing control loop, which results in a narrow bandwidth of usable signal frequencies and a wide bandwidth of higher noise that is subsequently filtered out. The full resolution result is generated by implementing a digital filter at the high clock frequency to remove all the frequency bands containing high noise and decimating at a decimation rate the information to a lower sampling rate. The remaining frequency band output is a narrow, low noise, frequency band, which is where the signal is expected to exist. The decimation rate is the ratio of the high sampling rate to the low sampling rate. The process of filtering the 1-bit SDM output into a usable multi-bit result requires from 16 to 1024 or greater high frequency clocks cycles depending on accuracy, latency, and frequency bandwidth requirements.

Some conventional overcurrent detection systems may convert, using a current-to-voltage element, a sensed current into a voltage and sample the voltage with a 1-bit SDM ADC generating a modulated 1-bit stream. The 1-bit SDM ADC converts an analog signal (e.g., the voltage) into a high frequency bit stream, which is then digitally filtered and decimated, using a decimation filter, to a lower sampling frequency data stream. The inventors have recognized that the conversion from a high sampling frequency bit stream to a low sampling frequency data stream incurs a time delay penalty as the 1-bit stream is processed into a multi-bit data result. The inventors have recognized that the higher the accuracy in the resulting conversion results in a longer time response through the decimation filter. The inventors have recognized that such a time delay penalty may correspondingly delay control system actions to prevent equipment damage and/or avoid compromises to user safety.

The overcurrent detection in some such conventional systems involves a logical comparison of the low sampling frequency data stream with a logic threshold. Detecting overcurrent events is often performed with a lower accuracy mid frequency data stream that results in a shorter time penalty as a trade-off between accuracy and time response. An example commonly used for current sensing is a second order SDM with a 1-bit output. To reconstruct the digital result, to a 16-bit resolution, a third order SINC decimation filter with a decimation rate of 256 is employed. The third order SINC decimation filter with a 256 decimation rate requires 768 clock cycles, 768 1-bit data values, to output a single sample with 16-bit resolution and sufficient signal to noise ratio. Overcurrent detection may employ a first order SINC decimation filter with a decimation rate of 16 or 32, which reduces the accuracy for a reduction in latency. The first order SINC decimation filter requires 32 to 64 clock cycles, based on decimation rate, to output a sample 5-bits to 6-bits of resolution. The inventors have recognized that requiring 32 to 64 clock cycles may cause undesirable delays in overcurrent detection and associated equipment control operations.

Some conventional overcurrent detection systems may add a comparator in parallel to the 1-bit SDM ADC to address high latency. The parallel comparator independently compares the absolute voltage of the input to a fixed or configurable threshold. A comparator may result in a low latency response. However, the inventors have recognized that the comparator accuracy is not directly correlated to the 1-bit SDM ADC accuracy and often results in increased tolerance due to the independence of the systems. The inventors have recognized that selecting the threshold for the comparator further increases the potential errors as the threshold may be independent of the 1-bit SDM ADC conversion reference. Although some monolithic designs including the comparator and 1-bit SDM ADC may share certain resources that reduce the number of independent characteristics, the inventors have recognized that characteristics will remain that result in differences in how the threshold and gain drift over temperature. The inventors have thereby recognized that adding a comparator in parallel to the 1-bit SDM ADC address the high latency related problems of the 1-bit SDM ADC, but at the cost of accuracy, die area, and power consumption. Put another way, adding a comparator in parallel to the 1-bit SDM ADC decreases accuracy of the overcurrent detection system while consuming increased power and portions of the die area with respect to non-comparator systems.

The inventors have developed techniques for overcurrent detection with multi-bit ADCs that overcome the problems of 1-bit SDM ADCs in conventional overcurrent detection systems. Example overcurrent detection systems described herein include one or more multi-bit ADCs configured to operate with higher bandwidth and equivalent and/or exceeding resolution and noise performance with respect to 1-bit SDM ADCs in conventional overcurrent detection systems. Advantageously, the multi-bit ADC(s) can be configured to perform overcurrent detection with lower processing time (e.g., lower latency) with respect to the higher processing time required to convert a 1-bit data stream from a 1-bit SDM ADC into a usable conversion result.

Example multi-bit ADC(s) described herein can be included in the signal measurement chain that senses an operating condition of a device or equipment. For example, the multi-bit ADC(s) can convert a voltage output from a current-to-voltage element into a useful result without additional hardware in parallel, such as a comparator. Advantageously, the inclusion of the multi-bit ADC(s) in the signal measurement chain eliminates the errors in conventional systems that are introduced by adding a comparator in parallel to a 1-bit SDM ADC. Further, performing overcurrent detection using multi-bit ADCs as described herein enables development and operation of safer and higher performance systems than those implemented using conventional overcurrent detection approaches.

The techniques described herein may be implemented in any of numerous ways, as the techniques are not limited to any particular manner of implementation. Examples of details of implementation are provided herein solely for illustrative purposes. Furthermore, the techniques disclosed herein may be used individually or in any suitable combination, as aspects of the technology described herein are not limited to the use of any particular technique or combination of techniques.

Turning to the figures, the illustrated example of FIG. 1 is a circuit diagram of an example control system 100 including an overcurrent detection system 102 to detect an overcurrent condition of a motor 104. For example, the overcurrent detection system 102 can be configured to detect when a current 106 of the motor 104 meets and/or exceeds a threshold (e.g., a current threshold).

The control system 100 may be an equipment control system. Examples of the equipment control system include a motor control system (shown), a robot control system (e.g., industrial robots, collaborative robots (cobots)), an alternator control system, and an electric generator control system (e.g., a turbine).

The control system 100 of FIG. 1 is a motor control system configured to control the motor 104. The motor 104 may be an electric motor having one or more windings. For example, the motor 104 may be a three-phase alternating current (AC) motor having three windings. The motor 104 may be a 230/400 AC voltage motor such that the motor 104 may operate on either a 380 volts (V) AC power system or a 415 V AC system without being damaged. Alternatively, the motor 104 may operate at a voltage within a different voltage range such as a voltage in a range of 100 to 500 V AC.

The motor 104 is shown as having a motor winding inductance 108, which is an inductance of a winding (not shown) of the motor 104. The current 106 shown may be the motor phase current in the winding. The winding may represent one of the phases of the motor 104.

The motor 104 is controlled by the current 106 output from a driver 110. The driver 110 is a half bridge driver. Alternatively, the driver 110 may be a full bridge driver. The driver 110 includes a first gate driver 112 coupled to a first switch 114 and a second gate driver 116 coupled to a second switch 118 in a half bridge configuration.

The switches 114, 118 may be respectively implemented by transistors. Examples of transistors include a field-effect transistor (FET), a bipolar junction transistor (BJT) (e.g., an NPN BJT, a PNP BJT), and an insulated-gate bipolar transistor (IGBT). Examples of FETs include power FETs and metal-oxide-semiconductor field-effect transistors (MOS-FETs) (e.g., p-channel MOSFETs, n-channel MOSFETs, etc.). For example, the shown switches 114, 118 are n-channel MOSFETs, but the driver 110 may be implemented using different types of transistors.

The control system 100 of FIG. 1 shows the control and sensing for one phase of the motor 104. For example, the driver 110 and portion(s) of the overcurrent detection system 102 are provided for control and sensing of one phase of the motor 104. In such an example, an additional driver 110 and additional portion(s) of the overcurrent detection system 102 are needed for control and sensing of another phase of the motor 104 in the case of the motor 104 being a multi-phase motor. Furthering the example, an additional driver 110, sense resistor 122, amplifier 124, and multi-bit ADC 126 are needed for additional phases of the motor 104. In some embodiments, the system controller 120 may be used for all phases of the motor 104. Alternatively, an instance of the system controller 120 may be used for each phase of the motor 104.

A system controller 120 is shown coupled to the driver 110. For example, the system controller 120 can be configured to control the driver 110 by outputting control signals to respective ones of the gate drivers 112, 116. The system controller 120 may increase or decrease the current 106 provided to the motor 104 by outputting control signals to one or both gate drivers 112, 116.

The system controller 120 may be implemented by a processor. Example processors include programmable logic controllers (PLCs), microcontroller units (MCUs), field programmable gate arrays (FPGAs), and digital signal processors (DSPs). Alternatively, the system controller 120 may be implemented by one or more hardware-implemented state machines or one or more application specific integrated circuits (ASICs).

The driver 110 is coupled to the motor 104 through a sense resistor 122. The overcurrent detection system 102 includes the sense resistor 122 to sense the current 106 for detection of an overcurrent condition of the motor 104. Alternatively, the overcurrent detection system 102 may sense the current 106 within proximity of a field sensing element to generate a voltage for measurement. Examples of the field sensing element include a Hall effect sensor and a Rogowski coil.

The sense resistor 122 is a current-to-voltage element configured to convert the current 106 output from the driver 110 into a voltage. In the current control loop, the current 106 in the motor winding is sensed by the sense resistor 122 to regulate the torque of the motor 104 under varying load conditions. Although shown as part of the overcurrent detection system 102, the sense resistor 122 may be separate from the overcurrent detection system 102.

The sense resistor 122 is shown coupled to an amplifier 124 (identified by "Av"). The amplifier 124 is a gain amplifier. For example, the amplifier 124 may implement a gain stage. The amplifier 124 may be configured to amplify the voltage converted by the sense resistor 122. As shown, a first terminal of the sense resistor 122 is coupled to a non-inverting terminal (identified by "+" symbol) of the amplifier 124 and a second terminal of the sense resistor 122 is coupled to an inverting terminal (identified by "−" symbol) of the amplifier 124.

The amplifier 124 is shown coupled to a multi-bit analog-to-digital converter (ADC) 126. The amplifier 124 may output an amplification of a voltage output by the sense resistor 122, and the amplification of the voltage output may correspond to the sensed current. The multi-bit ADC 126 may be configured to compare samples of an analog signal, such as the amplified voltage output from the amplifier 124, to a known reference voltage and then produce a digital representation of this analog signal. The output of the multi-bit ADC 126 may be a digital binary code representing multiple bits of binary (digital data).

Examples of the multi-bit ADC 126 include a successive approximation register (SAR) ADC, a flash ADC, a pipeline ADC, a dual slope ADC. For example, the multi-bit ADC 126 may be implemented by ADC topologies, such as a SAR ADC topology, that convert the sampled analog voltage into a full value digital result within a step or multiple steps at a high frequency relative to the sampling rate. In such an example, the multi-bit ADC 126 may be implemented by an ADC topology that samples an analog voltage and converts the sampled voltage into a digital result in a time window that is less than the Nyquist sampling period. In some embodiments, the multi-bit ADC 126 may be a combination of two or more of these ADC topologies.

The multi-bit ADC 126 is shown coupled to the system controller 120. In some embodiments, the multi-bit ADC 126 may output multiple bits to the system controller 120 in parallel. For example, the multi-bit ADC 126 may be configured with separate terminals coupled to the system controller 120 and each configured for output of an individual bit to the system controller 120. In such an example, the multi-bit ADC 126 may output a parallel multi-bit ADC code to the system controller 120. By way of example, the multi-bit ADC 126 may be configured with 16 separate terminals coupled to the system controller 120 to provide a 16-bit ADC code to the system controller 120. Alternatively, the multi-bit ADC 126 may be configured with a different number of terminals.

Components of the overcurrent detection system 102 and/or, more generally, the control system 100, may be coupled to one(s) of each other through one or more electrical connections. Examples of electrical connections include opto-isolators, pads, traces, wires, and vias. For example, the amplifier 124 may be coupled to the multi-bit ADC 126 using one or more traces (e.g., printed circuit board (PCB) traces).

In some embodiments, the multi-bit ADC 126 may output multiple bits serially (e.g., sequentially) to the system controller 120. For example, the multi-bit ADC 126 may be configured with one or more terminals coupled to the system controller 120 for output of a sequential series of bits timed to the pulse of a clock signal. In such an example, the sequential series of bits may be output using a bus. For example, the bus may be an Inter-Integrated Circuit (I2C) bus or a Serial Peripheral Interface (SPI) bus.

The multi-bit ADC 126 may convert an input voltage, such as the amplified voltage from the amplifier 124, into a multi-bit digital signal. The multi-bit ADC 126 may output the multi-bit digital signal to the system controller 120. The system controller 120 may compare the multi-bit binary code represented by the multi-bit digital signal to an overcurrent detection threshold. The overcurrent detection threshold may be a reference or known multi-bit binary code. For example, the overcurrent detection threshold may correspond to a measurement of electrical current at or above which indicates an overcurrent condition of the motor 104. In such an example, the system controller 120 may detect, based on the comparison, that the current 106 meets and/or exceeds a current threshold that corresponds to the overcurrent detection threshold. For example, the system controller 120 may monitor the system 100 for shorts (e.g., short circuits) or excessive load conditions that may damage the system 100 or components of the system 100, such as the motor 104.

In response to detecting the overcurrent condition of the motor 104, the system controller 120 may control the driver 110 to reduce and/or stop the current 106 provided to the motor 104. For example, the system controller 120 may output signals to the driver 110 to disable the driver 110. By disabling the driver 110, the system controller 120 may stop providing current to the motor 104 to shut down the motor 104 to prevent damage to the motor 104 and prevent user safety (e.g., a user operating the motor 104) from being compromised.

To protect the system 100 from damage and/or external environmental damage, the detection of an overcurrent condition must be communicated to the system controller 120 within a shorter period of time relative to the system dynamics in order for the system controller 120 to make a decision to halt operation or make corrective actions. The multi-bit ADC 126 may convert the sensed current into a useful digital result for overcurrent detection with less latency compared to conventional approaches such as sigma delta modulator (SDM) ADCs. Advantageously, the multi-bit ADC 126 may output the digital result to the system controller 120 within a shorter period of time relative to the dynamics of the system 100 to enable the system controller 120 to make the decision to halt operation or make corrective actions.

Figure 2:
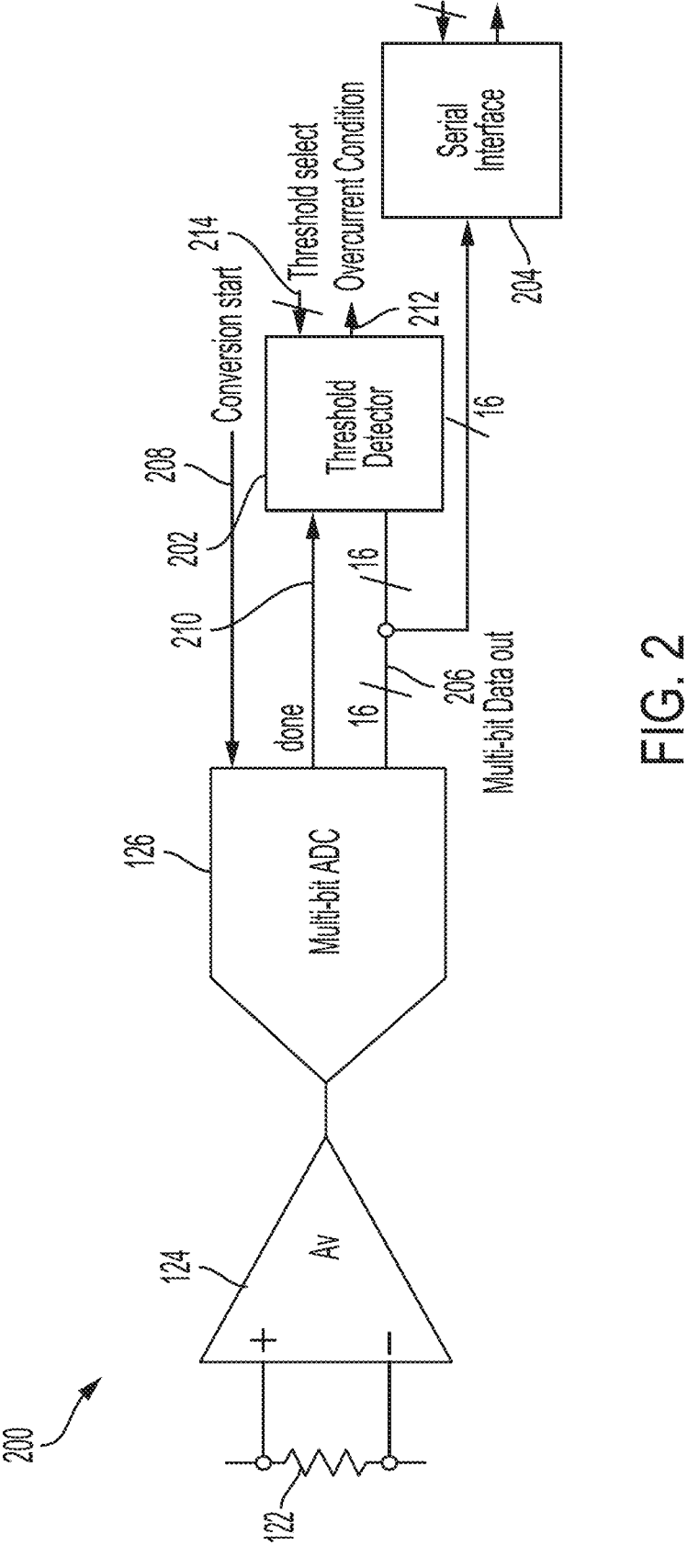
FIG. 2 is a circuit diagram of an example implementation of the overcurrent detection system of FIG. 1 including a serial interface, in accordance with some embodiments.

FIG. 2 is a circuit diagram of an example overcurrent detection system 200. The overcurrent detection system 200 may be an example implementation of the overcurrent detection system 102 of FIG. 1. For example, the overcurrent detection system 200 of FIG. 2 includes the sense resistor 122, the amplifier 124, and the multi-bit ADC 126 of FIG. 1.

The overcurrent detection system 200 further includes a threshold detector 202. The threshold detector 202 may implement a threshold detector circuit (or a threshold detection circuit). For example, the threshold detector 202 may be implemented by one or more analog circuits (e.g., capacitors, comparators, diodes, inductors, operational amplifiers, resistors, transistors, etc.) and/or one or more digital circuits (e.g., logic gates). In such an example, the threshold detector

202 may be implemented by one or more digital circuits that form a digital comparator, one or more logic gates, and/or one or more flip-flops.

The overcurrent detection system 200 further includes a serial interface 204. The serial interface 204 may implement a serial interface circuit. For example, the serial interface 204 may be implemented by a wireline transceiver, such as an I2C transceiver or a SPI transceiver.

As shown, outputs of the multi-bit ADC 126 are coupled to the threshold detector 202. Example outputs include legs, pins, and terminals. As shown, an output of the multi-bit ADC 126 is coupled to an input of the serial interface 204. Example inputs include legs, pins, and terminals.

The multi-bit ADC 126 converts a voltage output from the amplifier 124 into a digital output 206 upon receiving a conversion start signal 208. For example, the multi-bit ADC 126 may begin to convert (e.g., sample) the voltage output in response to receiving the conversion start signal 208. In some embodiments, the system controller 120 of FIG. 1 may provide the conversion start signal 208 to the multi-bit ADC 126.

The digital output 206 is a multi-bit digital signal. The multi-bit digital signal may be representative of a multi-bit data output. In the shown example, the digital output 206 is a 16-bit digital signal representative of a 16-bit data output. For example, the multi-bit ADC 126 may convert the voltage output from the amplifier 124 into a 16-bit digital signal. Alternatively, the digital output 206 may be a multi-bit digital signal representative of a number of bits in a range of 6 to 18 bits.

The multi-bit ADC 126 provides the digital output 206 to the threshold detector 202. As shown, the digital output 206 is a parallel multi-bit ADC code. Alternatively, the multi-bit ADC 126 may provide the digital output 206 to the threshold detector 202 using a bus. Examples of the bus include a SPI bus and an I2C bus. For example, the multi-bit ADC 126 may output the digital output 206 as a bitstream using the bus in accordance with a bus protocol (e.g., a SPI bus protocol, an I2C bus protocol).

Upon transmission of the 16-bit data output to the threshold detector 202 in this example, the multi-bit ADC 126 generates a completion signal 210 (identified by "DONE"). The multi-bit ADC 126 provides the completion signal 210 to the threshold detector 202 to indicate that the digital output 206 is ready for processing.

Upon receiving the completion signal 210, the threshold detector 202 executes a comparison of the digital output 206 and an overcurrent detection threshold. The threshold detector 202 executes the comparison to determine whether the digital output 206 is indicative of an overcurrent condition. For example, the threshold detector 202 may be configured to generate an overcurrent condition signal 212 in response to a detection of at least a first number of bits of the digital output 206 satisfying the overcurrent detection threshold. In such an example, the threshold detector 202 may output the overcurrent condition signal 212 to the system controller 120 of FIG. 1 to take corrective action in connection with the motor 104, such as shutting down the motor 104 and/or changing a rotational speed of the motor 104.

The overcurrent condition signal 212 may be a signal indicative of whether an overcurrent condition is detected with the motor 104 and/or, more generally, the system 100 of FIG. 1. For example, the overcurrent condition signal 212 may be a flag (e.g., an overcurrent detection flag) or indicator (e.g., an overcurrent indicator) that is de-asserted when an overcurrent condition is not detected and asserted when an overcurrent condition is detected.

The threshold detector 202 may be configured to compare the digital output 206 with a fixed or configurable overcurrent detection threshold. The overcurrent detection threshold may be configured (e.g., selected) using a threshold select input 214 of the threshold detector 202. For example, the threshold select input 214 may be used to set the overcurrent detection threshold. Alternatively, the threshold select input 214 may be used to adjust, change, and/or modify the overcurrent detection threshold.

The threshold select input 214 may be configured to receive a multi-bit digital signal via a bus. The bus may be a SPI bus or an I2C bus. In such an example, the system controller 120 may provide the multi-bit digital signal to the threshold detector 202 via the threshold select input 214 and a bus in accordance with a bus protocol.

The multi-bit digital signal provided to the threshold select input 214 may be representative of a threshold value. For example, the threshold value may be a 16-bit value (or a different number of bits) that corresponds to a motor winding current meeting and/or exceeding a current threshold indicative of an overcurrent condition.

The threshold detector 202 may use the 16-bit threshold value as the overcurrent detection threshold for overcurrent detection. For example, the threshold detector 202 may be a multi-bit threshold detector. The threshold detector 202 may compare the 16-bit digital output from the multi-bit ADC 126 and the 16-bit threshold value. In response to determining that the 16-bit digital output meets the 16-bit threshold value, the threshold detector 202 may generate the overcurrent condition signal 212 to be indicative of a detection of an overcurrent condition.

The overcurrent detection system 200 of FIG. 2 further includes the serial interface 204 to output communication data in accordance with a bus protocol. The serial interface 204 may be configured to output the communication data to another device. For example, the serial interface 204 may be a SPI interface that transmits the digital output 206 to a controller. In such an example, the serial interface 204 may output the digital output 206 to the system controller 120 using a SPI bus and in accordance with a SPI bus protocol.

Advantageously, in contrast to conventional overcurrent detection systems that use a sigma delta modulator (SDM) ADC, the approach shown in FIG. 2 achieves a full conversion result in a short period of time for a high bandwidth measurement. Configuring the multi-bit ADC 126 to generate a full digital result in a short period allows processing of the converted result immediately after the conversion is complete. To take advantage of this feature, the approach shown in FIG. 2 compares the converted result (e.g., the digital output 206) with a multi-bit threshold (e.g., the reference digital output) to enable a fast overcurrent detection to be completed. As shown in FIG. 2, the threshold detector 202 executes a comparison of the current ADC result (e.g., the digital output 206) to a fixed or configurable threshold (e.g., the reference digital output provided by the threshold select input 214).

In some embodiments, the response time of the multi-bit ADC 126 and the threshold detector 202 is approximately two times the sampling rate of the multi-bit ADC 126 plus the time delay of the logical compare function in the threshold detector 202. The overcurrent detection can be communicated to the system controller 120 and actions can be taken to protect user(s) and/or the system 100 of FIG. 1 from potential damage.

Advantageously, the approach shown in FIG. 2 overcomes problems with conventional overcurrent detection systems that use a comparator in parallel with 1-bit SDM ADCs. From the standpoint of correlating the measurements communicated to the system 100 and the overcurrent detection threshold, there is a single source of information. The reference voltage of the multi-bit ADC 126 and gain or offset characteristics are consistent for the system measurement (e.g., the sense resistor 122, the amplifier 124) and the threshold comparison. Any configuration or trimming to improve the accuracy, affects the multi-bit ADC 126 and the measurement that is communicated to the system 100 and the threshold comparison equally. Detecting the overcurrent condition within the logic of the multi-bit ADC 126 and communicating the overcurrent detection with an independent overcurrent detection signal reduces the latency to the system 100 versus the time to communicate a full multi-bit result that is often communicated serially. If the multi-bit ADC 126 results and the threshold comparison is uncorrelated, the errors will not track over environmental effects such as temperature and voltage supplies or references.

Figure 3:
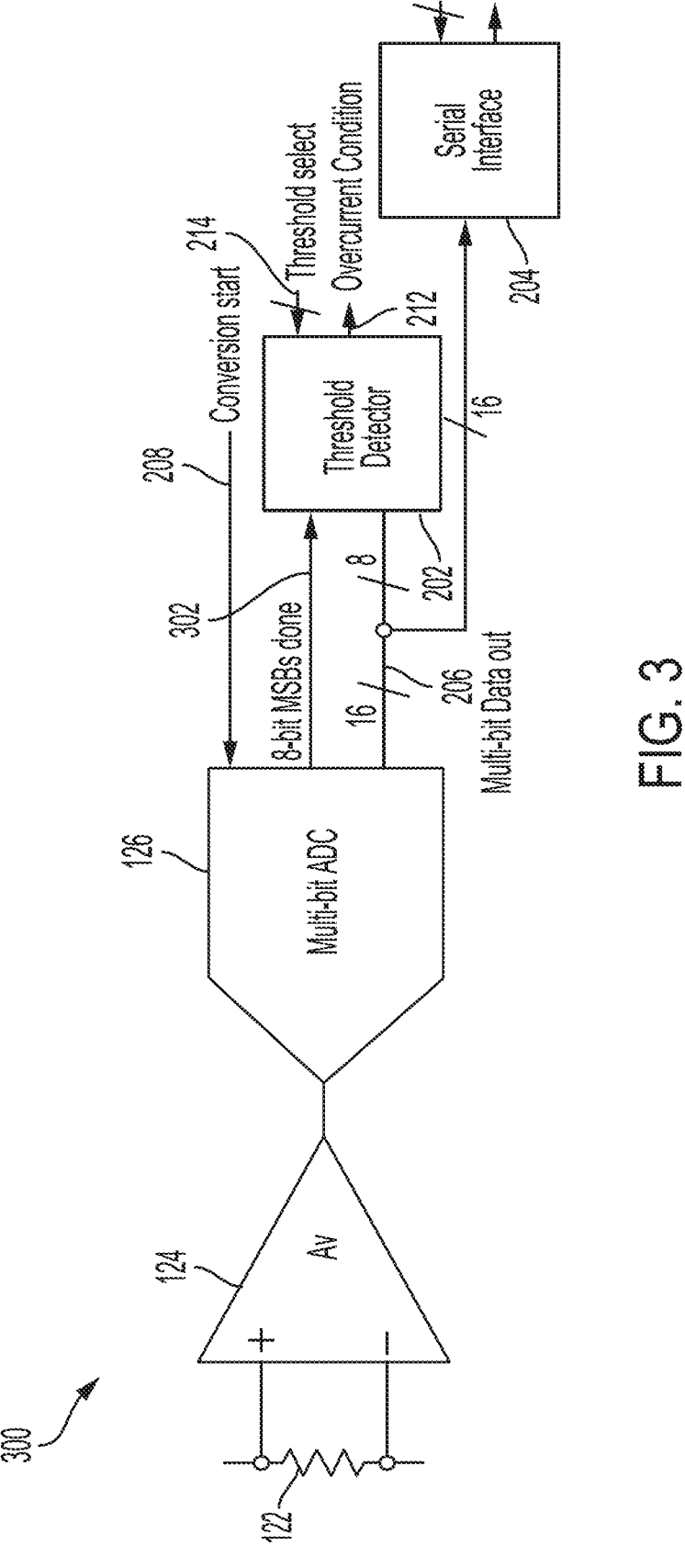
FIG. 3 is a circuit diagram of another example implementation of the overcurrent detection system of FIG. 1, in accordance with some embodiments.

FIG. 3 is a circuit diagram of an example overcurrent detection system 300 that may have a faster response time than the overcurrent detection system 200 of FIG. 2. The overcurrent detection system 300 may be an example implementation of the overcurrent detection system 102 of FIG. 1 and/or the overcurrent detection system 200 of FIG. 2. For example, the overcurrent detection system 300 of FIG. 3 includes the sense resistor 122, the amplifier 124, and the multi-bit ADC 126 of FIG. 1. The overcurrent detection system 300 further includes the threshold detector 202 and the serial interface 204 of FIG. 2.

Advantageously, detecting the overcurrent condition with the multi-bit ADC 126 further allows a selectable tradeoff between accuracy and latency. For example, the multi-bit ADC 126 may convert the input signal (e.g., the voltage from the amplifier 124) to a digital result (e.g., the digital output 206) in successive steps of comparing the sampled input signal to incrementally smaller thresholds. In such an example, the multi-bit ADC 126 may be an SAR ADC that implements a binary search pattern. For example, the multi-bit ADC 126, when implemented by an SAR ADC, may binarily search for the result from most significant bit (MSB) to least significant bit (LSB) by repeatedly comparing the input signal to a threshold then dividing the input signal. The MSBs are resolved early in the process and once enough bits are resolved they can be used for logic comparison to a threshold for overcurrent detection, which is shown in FIG. 3.

As such, the overcurrent detection system 300 shown may be designed with an overcurrent detection accuracy relative to an 8-bit result for a faster response by using the early results in the conversion process. Alternatively, the overcurrent detection system 200 of FIG. 2 may be used for higher detection accuracy and slower response. For example, the overcurrent detection system 200 may use a later conversion step result in the conversion process to achieve 16-bit accuracy in contrast to the 8-bit accuracy of FIG. 3.

To achieve a faster overcurrent detection response in contrast to FIG. 2, the multi-bit ADC 126 shown in FIG. 3 outputs a completion signal 302 to the threshold detector 202. The completion signal 302 of FIG. 3 is indicative of whether the 8 MSBs of the 16-bit multi-bit data output of the multi-bit ADC 126 are processed. For example, in response to processing the 8 MSBs of the digital output 206, the multi-bit ADC 126 may generate the completion signal 302. In response to receiving the completion signal 302, the threshold detector 202 may compare the 8 MSBs of the digital output 206 to the overcurrent detection threshold. For example, the threshold detector 202 may generate the overcurrent condition signal 212 in response to determining that the 8 MSBs of the digital output 206 meet the overcurrent detection threshold.

To accommodate the 8 MSBs of this example, the overcurrent detection threshold may be an 8-bit threshold value. For example, the threshold select input 214 may be used to configure an 8-bit threshold value in contrast to a 16-bit threshold value used in connection with FIG. 2. Alternatively, the overcurrent detection system 300 shown in FIG. 3 may use a different number of bits for overcurrent detection. For example, the completion signal 302 may be generated in response to a different number of MSBs being processed, such as 4, 6, 10, etc. In such an example, the threshold select input 214 may be used to configure a 4, 6, 10, etc., multi-bit threshold value for overcurrent detection. Although the 8 MSBs of the digital output 206 are used for overcurrent detection in this example, the full digital output 206 is provided to the serial interface 204 for output to another device (e.g., the system controller 120 of FIG. 1).

Figures 4A, 4B:
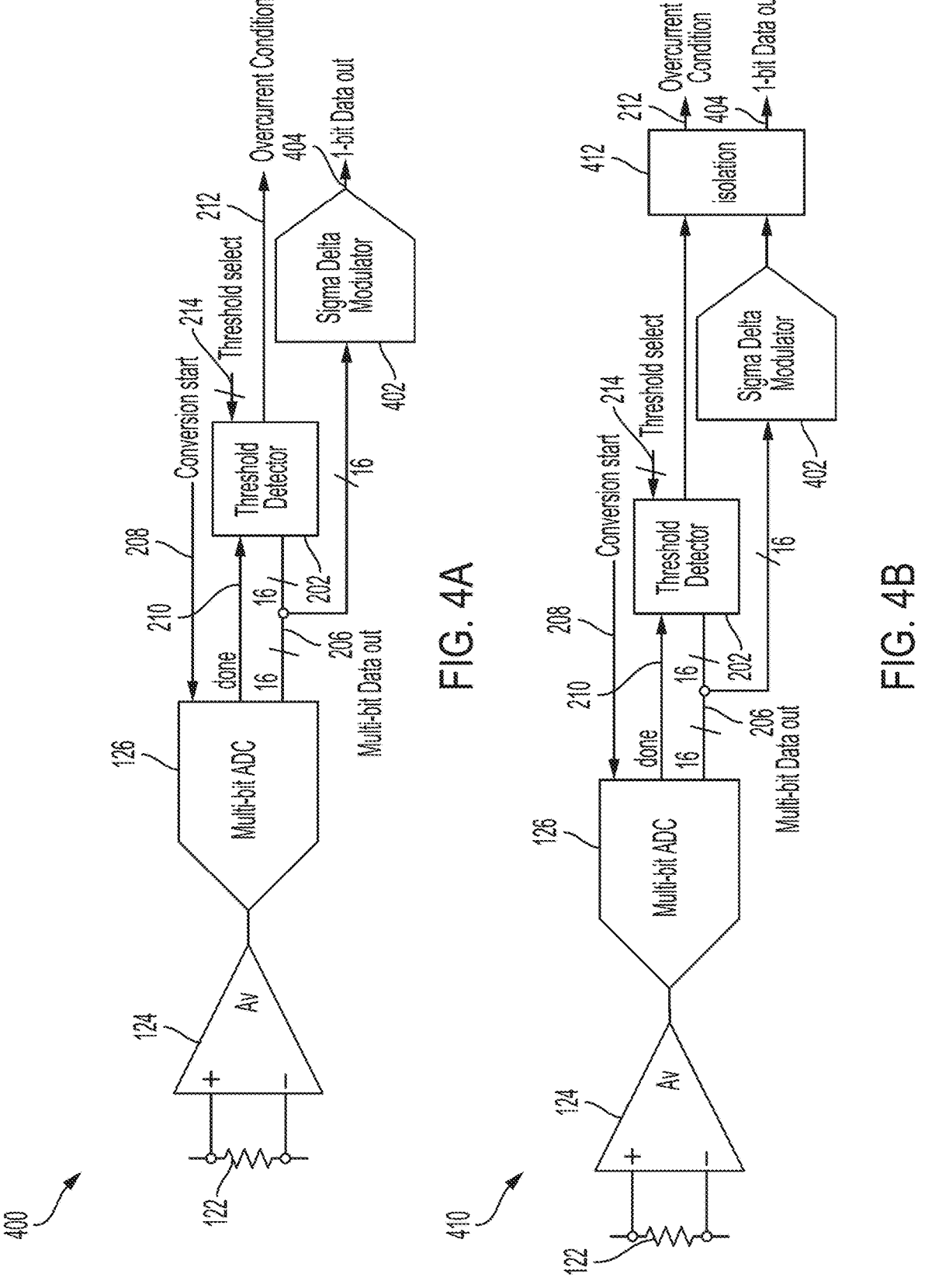
FIG. 4A is a circuit diagram of yet another example implementation of the overcurrent detection system of FIG. 1 including a sigma delta modulator, in accordance with some embodiments.
FIG. 4B is a circuit diagram of another example implementation of the overcurrent detection system of FIG. 1 including the sigma delta modulator of FIG. 4A and an isolator, in accordance with some embodiments.

FIG. 4A is a circuit diagram of an example overcurrent detection system 400 that may be used to improve interface compatibility with equipment control systems, such as the motor control system 100 of FIG. 1. For example, the overcurrent detection system 400 includes a sigma delta modulator 402 that may be configured to output data to a motor control interface, such as an electronic interface of the motor 104 of FIG. 1, and/or a motor system controller, such as the system controller 120 of FIG. 1.

The overcurrent detection system 400 may be an example implementation of the overcurrent detection system 102 of FIG. 1. For example, the overcurrent detection system 400 of FIG. 4A includes the sense resistor 122, the amplifier 124, and the multi-bit ADC 126 of FIG. 1. The overcurrent detection system 400 further includes the threshold detector 202 of FIG. 2.

As shown, the overcurrent detection system 400 employs a 1-bit data output 404 from the sigma delta modulator 402 to another device/interface, such as a motor control interface and/or a motor system controller. For example, the sigma delta modulator 402 may be configured to convert the digital output 206, which is a multi-bit data output, into the 1-bit data output 404. The 1-bit data output 404 may be digital data implemented by a 1-bit serial data stream. Alternatively, the sigma delta modulator 402 may be configured to output more than 1-bit.

In some embodiments, the system controller 120 may include and/or implement a decimation filter on the 1-bit data output 404 from the sigma delta modulator 402 to convert it to a data result. Advantageously, the response of the overcurrent detection to the system controller 120 (as provided by the threshold detector 202) is shorter than the time to decimate the 1-bit data output 404 into a result for comparison, but the 1-bit data output 404 from the sigma delta modulator 402 may be provided for improved interface compatibility with a variety of equipment control systems.

FIG. 4B is a circuit diagram of another example overcurrent detection system 410 that may be used to improve interface compatibility with equipment control systems, such as the motor control system 100 of FIG. 1. For example, the overcurrent detection system 410 includes the sigma delta modulator 402 of FIG. 4A that may be configured to interface and/or otherwise exchange data with an electronic interface of the motor 104 of FIG. 1 and/or a motor system controller, such as the system controller 120 of FIG. 1.

The overcurrent detection system 410 may be an example implementation of the overcurrent detection system 102 of FIG. 1. For example, the overcurrent detection system 410 of FIG. 4B includes the sense resistor 122, the amplifier 124, and the multi-bit ADC 126 of FIG. 1. The overcurrent detection system 400 further includes the threshold detector 202 of FIG. 2.

The overcurrent detection system 400 shown in FIG. 4B may use isolation 412 between circuit components to reduce a likelihood of damage to one(s) of the circuit components. For example, the isolation 412 may be implemented by one or more isolators to protect downstream components of the isolation 412, such as a controller, from potential high-voltage spikes in connection with high voltage of the motor winding of the motor 104. The one or more isolators may be one or more galvanic isolators. Alternatively, the isolation 412 may be implemented using optical isolation. For example, the isolation 412 may be one or more opto-isolators (also known as optical couplers, photocouplers, or optocouplers) to implement optical isolation.

In the illustrated example of FIG. 4B, output(s) of the threshold detector 202 and the sigma delta modulator 402 are coupled to input(s) of the isolation 412. As shown, the threshold detector 202 provides the overcurrent condition signal 212 to the isolation 412, which in turn, outputs the overcurrent condition signal 212 to another device (not shown). Also shown, the sigma delta modulator 402 provides the 1-bit data output 404 to the isolation 412 which, in turn, provides the 1-bit data output 404 to another device (not shown).

Figures 5, 6:
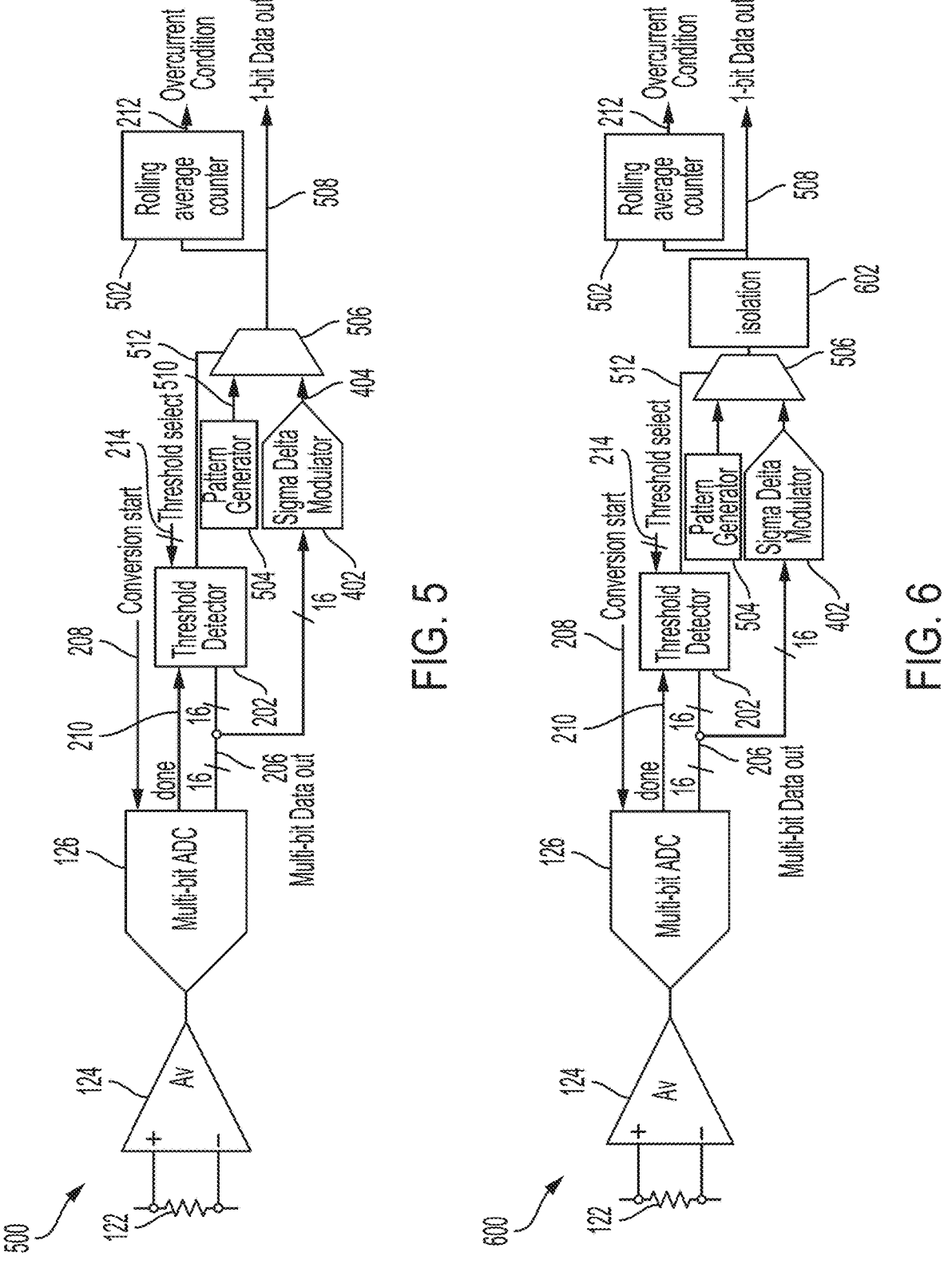
FIG. 5 is a circuit diagram of a further example implementation of the overcurrent detection system of FIG. 1 including a rolling average counter, in accordance with some embodiments.
FIG. 6 is a circuit diagram of yet another example implementation of the overcurrent detection system of FIG. 1 including a rolling average counter and an isolator, in accordance with some embodiments.

FIG. 5 is a circuit diagram of an overcurrent detection system 500 that may use a rolling average counter 502 to detect a fault pattern generated by a pattern generator 504. For example, the rolling average counter 502 may be configured to detect whether a pattern of an input signal to the rolling average counter 502 matches the fault pattern. The pattern generator 504 may implement a pattern generator circuit (or a pattern generation circuit). For example, the detection of the fault pattern may improve a likelihood of overcurrent detection and/or to reduce a likelihood of a false positive or false negative overcurrent detection.

The overcurrent detection system 500 may be an example implementation of the overcurrent detection system 102 of FIG. 1, the overcurrent detection system 400 of FIG. 4A, and/or the overcurrent detection system 410 of FIG. 4B. For example, the overcurrent detection system 500 of FIG. 5 includes the sense resistor 122, the amplifier 124, and the multi-bit ADC 126 of FIG. 1. The overcurrent detection system 500 further includes the threshold detector 202 of FIG. 2 and the sigma delta modulator 402 of FIGS. 4A-4B.

As shown, the overcurrent detection system 500 includes a multiplexer 506 to output a digital output 508 responsive to whether an overcurrent condition is detected. In the shown example, an output of the threshold detector 202 is coupled to a select input of the multiplexer 506. Further, an output of the pattern generator 504 is coupled to a first input of the multiplexer 506. Additionally, an output of the sigma delta modulator 402 is coupled to a second input of the multiplexer 506.

In the illustrated example, the multiplexer 506 receives, on its first input, a fault pattern signal 510 representative of a fault pattern generated by the pattern generator 504. In some embodiments, the fault pattern may be a bitstream of a plurality of logic ones followed by a logic zero. In other embodiments, the fault pattern may be a bitstream of a plurality of logic zeros followed by a logic one. Alternatively, the fault pattern may be a bitstream of any other combination of logic ones and zeros. Further, the multiplexer 506 receives, on its second input, the 1-bit data output 404 from the sigma delta modulator 402.

The multiplexer 506 selects from either the fault pattern signal 510 or the 1-bit data output 404 responsive to a threshold detection signal 512 from the threshold detector 202. For example, the threshold detector 202 may generate the threshold detection signal 512 in response to detecting the digital output 206 meets the overcurrent detection threshold (e.g., the 16-bit threshold value). In some embodiments, the threshold detection signal 512 may implement the overcurrent condition signal 212 of FIGS. 2-4B.

In response to the threshold detection signal 512 not indicating an overcurrent condition detection, the multiplexer 506 outputs the 1-bit data output 404 from the sigma delta modulator 402 as the digital output 508. In example operation, the rolling average counter 502 may, based on the 1-bit data output 404, generate the overcurrent condition signal 212 to indicate that an overcurrent condition is not detected. Put another way, the rolling average counter 502 may generate the overcurrent condition signal 212 to indicate that the motor 104 and/or, more generally, the system 100 of FIG. 1, is operating within normal or desired operating parameters (e.g., a specified motor winding current, motor torque, motor rotational speed).

In response to the threshold detection signal 512 indicating an overcurrent condition detection, the multiplexer 506 outputs the fault pattern signal 510 as the digital output 508. In example operation, the rolling average counter 502 may, based on detecting the fault pattern signal 510, generate the overcurrent condition signal 212 to indicate that an overcurrent condition is detected. Put another way, the rolling average counter 502 may generate the overcurrent condition signal 212 to indicate that the motor 104 and/or, more generally, the system 100 of FIG. 1, is operating outside of normal or desired operating parameters.

The rolling average counter 502 may calculate a rolling average of data values received on its input. The rolling average counter 502 may remove unique pattern pulses using a filter. The filter may be a 1-pulse filter. Alternatively, a different filter may be used such as a SINC filter. An example of a SINC filter is a first order SINC filter.

By way of example, under normal operating conditions of the system 100, the rolling average counter 502 may receive the 1-bit data output 404 from the sigma delta modulator 402 via the multiplexer 506. The rolling average counter 502 may not detect an overcurrent condition based on the rolling average of the data values represented by the 1-bit data output 404.

Furthering the example, under non-standard operating conditions of the system 100 such as an overcurrent condition of the motor 104, the rolling average counter 502 may receive the fault pattern signal 510 from the pattern generator 504 via the multiplexer 506. The rolling average counter 502 may detect an overcurrent condition based on the rolling average of the data values represented by the fault pattern signal 510 due to the sequential stream of logic ones (or logic zeros depending on the fault pattern).

FIG. 6 is a circuit diagram of an overcurrent detection system 600 that may use isolation 602 between circuit components to reduce a likelihood of damage to one(s) of the circuit components. For example, the isolation 602 may be implemented by one or more isolators to protect downstream components of the isolation 602, such as the rolling average counter 502, from potential high-voltage spikes in connection with high voltage of the motor winding of the motor 104. The one or more isolators may be one or more galvanic isolators. Alternatively, the isolation 602 may be implemented using optical isolation. For example, the isolation 602 may be one or more opto-isolators to implement optical isolation.

The overcurrent detection system 600 may be an example implementation of the overcurrent detection system 102 of FIG. 1, the overcurrent detection system 400 of FIG. 4A, the overcurrent detection system 410 of FIG. 4B, and/or the overcurrent detection system 500 of FIG. 5. For example, the overcurrent detection system 600 of FIG. 6 includes the sense resistor 122, the amplifier 124, and the multi-bit ADC 126 of FIG. 1. The overcurrent detection system 600 further includes the threshold detector 202 of FIG. 2 and the sigma delta modulator 402 of FIGS. 4A-4B. The overcurrent detection system 600 also includes the rolling average counter 502, and the pattern generator 504, the multiplexer 506 of FIG. 5.

In some embodiments, the overcurrent detection system 600 may be implemented by one or more integrated circuits (ICs) on a single die (e.g., a chip die, a semiconductor die). For example, ones of the sense resistor 122, the amplifier 124, the multi-bit ADC 126, the threshold detector 202, the sigma delta modulator 402, the pattern generator 504, the multiplexer 506, the isolation 602, and the rolling average counter 502 may be included on the same die.

In some embodiments, the overcurrent detection system 600 may be implemented by one or more ICs on multiple dies. By way of example, the overcurrent detection system 600 may be implemented using (i) a first die including at least the multi-bit ADC 126 and the threshold detector 202 and (ii) a second die including the rolling average counter 502. Additionally or alternatively, the first die may include one(s) of the sense resistor 122, the amplifier 124, the sigma delta modulator 402, the pattern generator 504, and the multiplexer 506.

Furthering the example, the isolation 602 may be an isolator having a primary side, a secondary side, and an isolation barrier formed between the primary side and the secondary side. The primary side of the isolator may be on the first die. For example, one or more electrical connections may couple the primary side of the isolator, which is on the first die, to the output of the multiplexer 506. The secondary side of the isolator may be on the second die. One or more electrical connections may couple the primary side of the isolator, which is on the first die, to the secondary side of the isolator, which is on the second die.

An alternative embodiment to the example shown in FIG. 6 may include the isolation 602 having multiple isolation channels. For example, the isolation 602 may include an isolator having a first isolation channel and a second isolation channel. The isolator may receive the threshold detection signal 512 using the first isolation channel. For example, the threshold detection signal 512 may be provided to the multiplexer 506 and/or the first isolation channel of the isolation 602. The isolator may output the threshold detection signal 512 as the overcurrent condition signal 212 using the first isolation channel. Additionally or alternatively, the isolator may receive the output from the multiplexer 506 using the second isolation channel. The isolator may output the output from the multiplexer 506 using the second isolation channel. The isolator may provide the output to the rolling average counter 502 and/or provide the output as the digital output 508.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the spirit and scope of the principles described herein. Accordingly, the foregoing description and drawings are by way of example only.

The invention claimed is:

1. An apparatus for overcurrent detection, comprising:
a multi-bit analog-to-digital converter (ADC) configured to convert an analog signal into a multi-bit digital signal; and
a threshold detector configured to generate an output signal indicative of an overcurrent condition in response to a detection of at least a first number of bits of the multi-bit digital signal satisfying a threshold.

2. The apparatus of claim 1, wherein the multi-bit digital signal is representative of a number of bits in a range of 6 to 18 bits.

3. The apparatus of claim 1, wherein the threshold detector comprises an input configured to set the threshold.

4. The apparatus of claim 1, further comprising a serial interface comprising an input coupled to an output of the multi-bit ADC, wherein the serial interface is configured to output communication data in accordance with a bus protocol.

5. The apparatus of claim 4, wherein the multi-bit ADC is configured to output the multi-bit digital signal to the threshold detector and the serial interface.

6. The apparatus of claim 1, wherein:
the multi-bit ADC is configured to generate a completion signal after the first number of bits is processed; and
the threshold detector is configured to generate the output signal in response to receiving the completion signal from the multi-bit ADC.

7. The apparatus of claim 1, further comprising a sigma delta modulator comprising an input coupled to an output of the multi-bit ADC.

8. The apparatus of claim 7, further comprising a multiplexer comprising a first input and a selection input, the first input is coupled to an output of the sigma delta modulator, and the selection input is coupled to an output of the threshold detector.

9. The apparatus of claim 8, wherein the multiplexer is configured to select a signal generated by the sigma delta modulator for output when the threshold is not satisfied.

10. The apparatus of claim 8, further comprising an isolator coupled to an output of the multiplexer.

11. The apparatus of claim 8, wherein the multiplexer comprises a second input, and further comprising a pattern generator comprising an output coupled to the second input, and the pattern generator is configured to generate a digital bitstream representative of a pattern when the threshold is satisfied.

12. The apparatus of claim 11, wherein the multiplexer comprises an output, and further comprising a rolling average counter comprising an input coupled to the output of the multiplexer, and the rolling average counter is configured to:
detect the pattern; and
generate a signal indicative of an overcurrent condition when the pattern is detected.

13. A system for overcurrent detection, comprising:
a first die comprising:
a multi-bit analog-to-digital converter (ADC) configured to convert an analog signal into a multi-bit digital signal;
a threshold detector configured to generate an output signal in response to a detection of at least a first number of bits of the multi-bit digital signal satisfying a threshold; and
a primary side of an isolator, the isolator having the primary side, a secondary side, and an isolation barrier formed between the primary side and the secondary side;
a second die comprising:
a rolling average counter configured to generate a signal indicative of an overcurrent condition after the output signal is generated; and
the secondary side of the isolator; and
an electrical connection coupling the primary side of the isolator of the first die to the secondary side of the isolator of the second die.

14. The system of claim 13, further comprising a gain amplifier comprising an output coupled to an input of the multi-bit ADC.

15. The system of claim 14, wherein the analog signal is a voltage, further comprising a sense resistor coupled to an input of the gain amplifier, and the sense resistor is configured to convert a current from a winding of an electric motor into the voltage.

16. The system of claim 13, wherein the first die comprises a serial interface comprising an input coupled to an output of the multi-bit ADC.

17. The system of claim 13, wherein the first die further comprises:
a multiplexer comprising a first input, a second input, a selection input, and an output, the selection input coupled to an output of the threshold detector, and the output coupled to the primary side of the isolator;
a pattern generator comprising an output coupled to the first input; and
a sigma delta modulator comprising an input and an output, the input coupled to an output of the multi-bit ADC, and the output coupled to the second input.

18. A method for overcurrent detection, comprising:
converting a sensed current into a voltage;
converting, using a multi-bit analog-to-digital converter, an amplification of the voltage into a multi-bit digital signal; and
detecting an overcurrent condition in response to at least a first number of bits of the multi-bit digital signal satisfying a threshold.

19. The method of claim 18, further comprising:
converting, using a sigma delta modulator, the multi-bit digital signal into a digital bitstream; and
outputting the digital bitstream to an output device when the overcurrent condition is not detected.

20. The method of claim 18, further comprising:
generating a bitstream representative of a pattern;
outputting the bitstream to a rolling average counter when the at least first number of bits of the multi-bit digital signal satisfies the threshold; and
generating, using the rolling average counter, an output signal indicative of detecting the overcurrent condition when the pattern represented by the bitstream is detected.

* * * * *